(12) United States Patent
Hyun

(10) Patent No.: US 12,467,893 B2
(45) Date of Patent: Nov. 11, 2025

(54) TEST DEVICE FOR DETERMINING AN EFFECTIVE WORK FUNCTION, METHOD OF MANUFACTURING THE SAME AND METHOD OF DETERMINING AN EFFECTIVE WORK FUNCTION

(71) Applicant: SK hynix Inc., Icheon-si (KR)

(72) Inventor: Gyeong Ho Hyun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 274 days.

(21) Appl. No.: 18/311,772

(22) Filed: May 3, 2023

(65) Prior Publication Data

US 2024/0118332 A1 Apr. 11, 2024

(30) Foreign Application Priority Data

Oct. 11, 2022 (KR) .................. 10-2022-0129851

(51) Int. Cl.
| | |
|---|---|
| *G01N 27/00* | (2006.01) |
| *G01R 31/26* | (2020.01) |
| *G11C 29/00* | (2006.01) |
| *H01L 21/66* | (2006.01) |
| *H10D 64/01* | (2025.01) |

(52) U.S. Cl.
CPC ....... *G01N 27/002* (2013.01); *G01R 31/2601* (2013.01); *H01L 22/14* (2013.01); *H10D 64/037* (2025.01); *G11C 29/006* (2013.01); *H01L 22/30* (2013.01)

(58) Field of Classification Search
CPC ............... G01N 27/002; H10D 64/037; G01R 31/2601; H01L 22/14; H01L 22/30; G11C 29/006
See application file for complete search history.

(56) References Cited

U.S. PATENT DOCUMENTS

| | | | | |
|---|---|---|---|---|
| 3,995,216 A | * | 11/1976 | Yun .................. | G01R 31/2637 |
| | | | | 324/762.01 |
| 5,475,319 A | * | 12/1995 | Hirae ................ | G01R 31/2656 |
| | | | | 257/E21.531 |
| 6,915,232 B2 | * | 7/2005 | Kitajima ........... | G01N 27/221 |
| | | | | 702/171 |

(Continued)

FOREIGN PATENT DOCUMENTS

KR 1020100077994 A 7/2010

OTHER PUBLICATIONS

Ainhoa Atxabal et al., Energy Level Alignment at Metal/Solution-Processed Organic Semiconductor Interfaces, Adv. Mater. 2017, vol. 29, Issue 19, 1606901, Advanced Materials, wileyonlinelibrary.com, Mar. 15, 2017.

(Continued)

*Primary Examiner* — Steven L Yeninas
(74) *Attorney, Agent, or Firm* — WILLIAM PARK AND ASSOCIATES LTD.

(57) ABSTRACT

A test device may include a test memory device, an insulation layer and a charge injection electrode. The test memory device may include a memory layer and a gate electrode layer on a semiconductor substrate. The insulation layer may be arranged on the test memory device. The charge injection electrode may be arranged on the insulation layer to inject a charge into the test memory device based on a voltage.

19 Claims, 8 Drawing Sheets

(56) References Cited

U.S. PATENT DOCUMENTS

| | | | | |
|---|---|---|---|---|
| 7,045,384 B1* | 5/2006 | Pan | ............... | H10D 8/051 |
| | | | | 438/105 |
| 8,729,620 B2* | 5/2014 | Yamazaki | ............... | H10D 86/40 |
| | | | | 257/314 |
| 2007/0132004 A1* | 6/2007 | Yasuda | ............... | H10B 43/30 |
| | | | | 257/E21.21 |
| 2016/0003888 A1* | 1/2016 | Weng | ............... | G01R 31/2621 |
| | | | | 324/762.01 |

OTHER PUBLICATIONS

Sanghun Jeon et al., High work-function metal gate and high-/spl kappa/ dielectrics for charge trap flash memory device applications, Institute of Electrical and Electronics Engineers, IEEE Transactions on Electron Devices, vol. 52, Issue 12, pp. 2654-2659, Dec. 2005.

* cited by examiner

TEST DEVICE FOR DETERMINING AN EFFECTIVE WORK FUNCTION, METHOD OF MANUFACTURING THE SAME AND METHOD OF DETERMINING AN EFFECTIVE WORK FUNCTION

CROSS-REFERENCES TO RELATED APPLICATION

The present application claims priority under 35 U.S.C. § 119(a) to Korean application number 10-2022-0129851, filed on Oct. 11, 2022, in the Korean Intellectual Property Office, which is incorporated herein by reference in its entirety.

BACKGROUND

1. Technical Field

Various embodiments generally relate to a test device for determining an effective work function, method of manufacturing the same and a method of determining an effective work function, more particularly, to a test device for determining an effective work function of a gate electrode in a memory device, a method of manufacturing the test device and a method of determining an effective work function.

2. Related Art

An effective work function of a gate electrode in a memory device may be a factor for affecting an erase characteristic of a memory layer including a tunnel insulation layer, a charge storage layer, and a blocking insulation layer. The effective work function of the gate electrode may correspond to an energy difference between a Fermi level of a metal constituting the gate electrode and a conduction band of oxide constituting the blocking insulation layer.

According to related arts, methods of measuring the effective work function of the metal may include a photoelectron spectroscopy, a Kelvin probe force microscopy, etc. Methods of measuring the conduction band of the oxide may include an inverse photoelectron spectroscopy.

However, the above-mentioned methods may be optical methods using light, which may require at least one optical apparatus. A metal sample or an oxide sample may have a region configured to receive the light so that the samples are required over a certain size. Thus, the optical apparatus's burden may exist. Further, it may be difficult to decrease the sizes of the samples. The measurements may be possible when the metal sample or the oxide sample is exposed to the atmosphere. Because the samples may be sensitive with respect to a surface contamination, the measurements may be performed in a vacuum. Further, the effective work function of the metal for the gate electrode might not be determined under a condition that the gate electrode may be in contact with the blocking insulation layer.

Therefore, it may be required to provide a technology for determining the effective work function of the gate electrode using a non-optical method under a condition that the gate electrode including the metal may be in contact with the blocking insulation layer including the oxide.

SUMMARY

According to example embodiments, there may be provided a test device for determining an effective work function. The test device may include a test memory device, an insulation layer and a charge injection electrode. The test memory device may include a memory layer and a gate electrode layer on a semiconductor substrate. The insulation layer may be arranged on the test memory device. The charge injection electrode may be arranged on the insulation layer to inject a charge into the test memory device in accordance with a voltage applying.

According to example embodiments, there may be provided a method of manufacturing a test device, which may be used for determining an effective work function of a gate electrode in a memory device. The memory device may include a semiconductor channel layer, a memory layer, and the gate electrode layer. In the method of manufacturing the test device, a test memory device may be formed on a semiconductor substrate. The test memory device may include a test memory layer and a test gate electrode layer. The test memory layer may include a material substantially the same as a material of the memory layer. The test gate electrode layer may include a material substantially the same as a material of the gate electrode layer. An insulation layer may be formed on the test memory device. A charge injection electrode configured to inject a charge into the test memory device may then be formed on the insulation layer in accordance with applying a voltage.

According to example embodiments, there may be provided a method of determining an effective work function. In the method of determining the effective work function, the effective memory device of a gate electrode layer may be determined using a test device may including a test memory device, an insulation layer and a charge injection electrode. The test memory device may include a memory layer and the gate electrode layer on a semiconductor substrate. The insulation layer may be arranged on the test memory device. The charge injection electrode may be arranged on the insulation layer. A capacitance change of the test memory device in accordance with a voltage applied to the charge injection electrode may be measured to determine the effective work function of the gate electrode layer.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Figure 1:
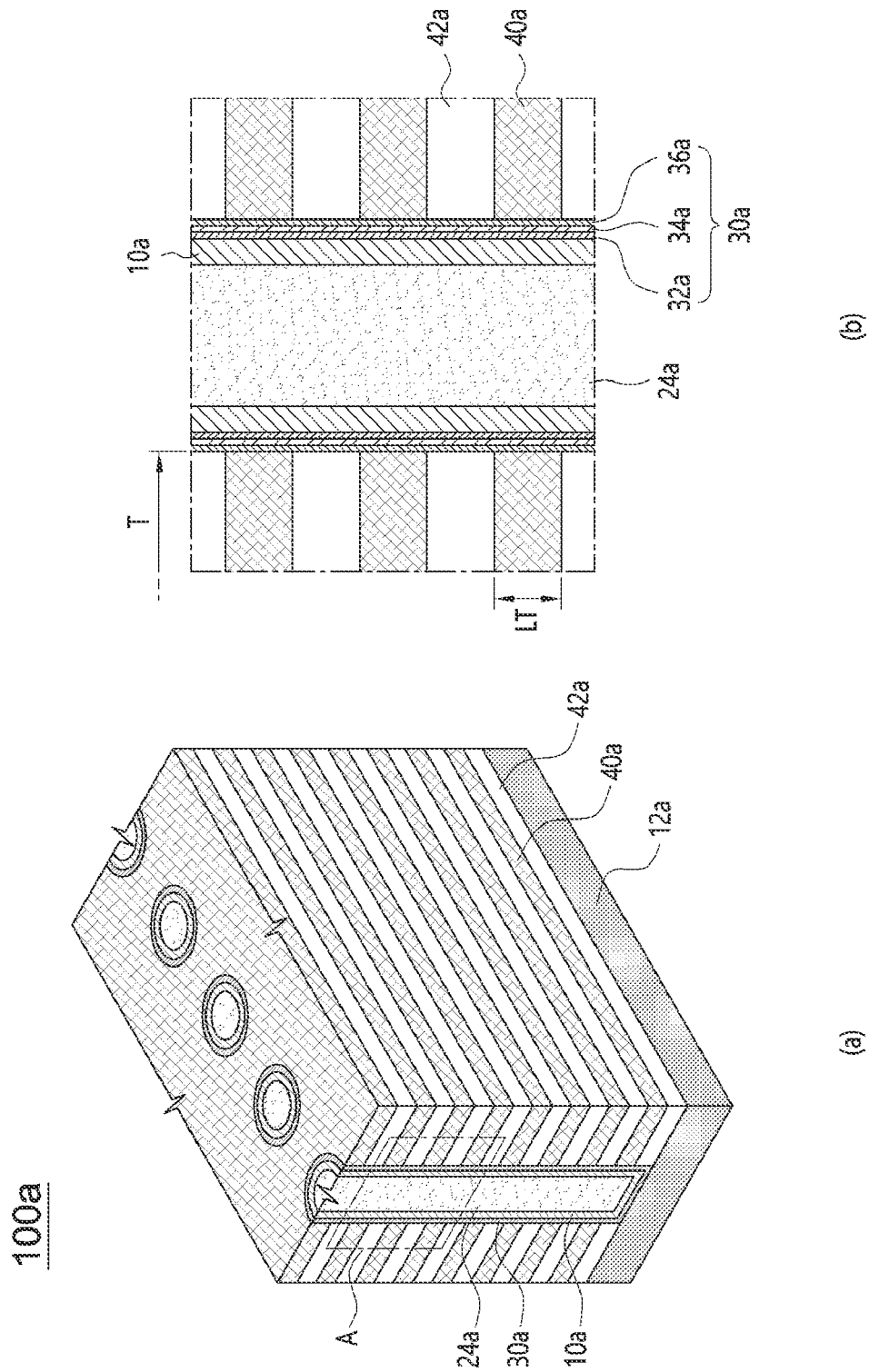
FIG. 1 is a view illustrating a memory device including a gate electrode of which an effective work function is determined by a test device in accordance with example embodiments.

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present disclosure is described herein with reference to cross-section and/or plan illustrations of idealized embodiments of the present invention. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present invention.

Example embodiments may provide a test device for determining an effective work function of a gate electrode in a memory device using a non-optical method, a method of manufacturing the test device and a method of determining an effective work function.

Particularly, example embodiments may provide a test device including a test pattern on a semiconductor substrate configured to accurately and simply determine an effective work function of a gate electrode in a memory device using a non-optical method, a method of manufacturing the test device and a method of determining an effective work function.

According to example embodiments, the effective work function of the gate electrode layer in the memory device may be determined using the non-optical method. Particularly, the test device may include a test pattern on the semiconductor substrate so that the effective work function of the gate electrode layer may be determined under a condition that the gate electrode layer may be attached to the blocking insulation layer. That is, the effective work function of the gate electrode layer with the gate electrode layer being attached to the blocking insulation layer may be accurately and simply determined.

Further, the test device may be manufactured using an apparatus or a process for manufacturing the memory device. Thus, the test device including the test memory device, which may have characteristics substantially the same as or similar to characteristics of the gate electrode layer in the memory device, may be manufactured through a simple method.

A test device for determining an effective work function may be used for determining an effective work function of a gate electrode in a memory device. Hereinafter, a memory device including a gate electrode of which the effective work function may be determined by the test device may be illustrated. The test device may then be illustrated.

FIG. 1 is a view illustrating a memory device including a gate electrode of which an effective work function is determined by a test device in accordance with example embodiments. (A) of FIG. 1 may be a partial perspective view illustrating the memory device 100a. (B) of FIG. 1 may be an enlarged cross-sectional view illustrating a portion "A" in (A) in FIG. 1. For definite understanding, FIG. 1 does not show a directly non-related portion with respect to the test device and any further illustrations with respect to the non-related portion has been omitted herein for brevity.

Referring to FIG. 1, a memory device 100a of example embodiments may have a vertical structure. For example, the memory device 100a may include a non-volatile memory device, such as a NAND flash memory device.

The memory device 100a may include a semiconductor channel layer 10a, a plurality of gate electrodes 40a, a memory layer 30a, and an insulating interlayer 42a. The semiconductor channel layer 10a may be vertically formed on a base substrate 12a. The gate electrodes 40a may be configured to surround at least a part of the semiconductor channel layer 10a. The memory layer 30a may be arranged between the semiconductor channel layer 10a and the gate electrodes 40a. The insulating interlayer 42a may be configured to isolate the gate electrodes 40a from each other. A core insulation layer 24a may be formed in the semiconductor channel layer 10a.

The base substrate 12a may include a semiconductor substrate, but the disclosure is not limited thereto. A material and a composition of the base substrate 12a may be variously changed.

The semiconductor channel layer 10a may include various semiconductor materials, such as silicon, germanium, a compound semiconductor in groups III-V. For example, the semiconductor channel layer 10a may include a semiconductor material having a p-type conductivity, for example, a p-type polycrystalline silicon layer, but the disclosure is not limited thereto. For example, the semiconductor channel layer 10a may include an n-type conductivity. The core insulation layer 24a may include various insulation materials, such as silicon oxide. In FIG. 1, the core insulation layer 24a and the semiconductor channel layer 10a may have a cylindrical shape having a circular cross-sectional shape, but the disclosure is not limited thereto.

The memory layer 30a may include a tunnel insulation layer 32a, a charge storage layer 34a, and a blocking insulation layer 36a sequentially formed on the semiconductor channel layer 10a between the semiconductor channel layer 10a and the gate electrode 40a. Particularly, the tunnel insulation layer 32a, the tunnel storage layer 34a, and the blocking insulation layer 36a may be sequentially formed on a side surface of the semiconductor channel layer 10a substantially perpendicular to the based substrate 12a to form the memory layer 30a. The gate electrode 40a and the insulating interlayer 42a may be alternately stacked on the base substrate 12a in a region except for the core insulation layer 24a, the semiconductor channel layer 10a, and the memory layer 30a.

The tunnel insulation layer 32a, the charge storage layer 34a, the blocking insulation layer 36a, and the gate electrode 40a may include various materials illustrated later in detail. The insulating interlayer 42a may include various insulation materials for electrically insulating the gate electrode 40a, for example, silicon oxide.

The memory device 100a may be an example for explaining the test device 100 of the embodiments, but the disclosure is not limited thereto. Thus, the memory device 100a may have the vertical structure with a structure different from the above-mentioned structure or a planar structure. The materials of the above-mentioned layers in the memory device 100a may be variously changed.

Figure 2:
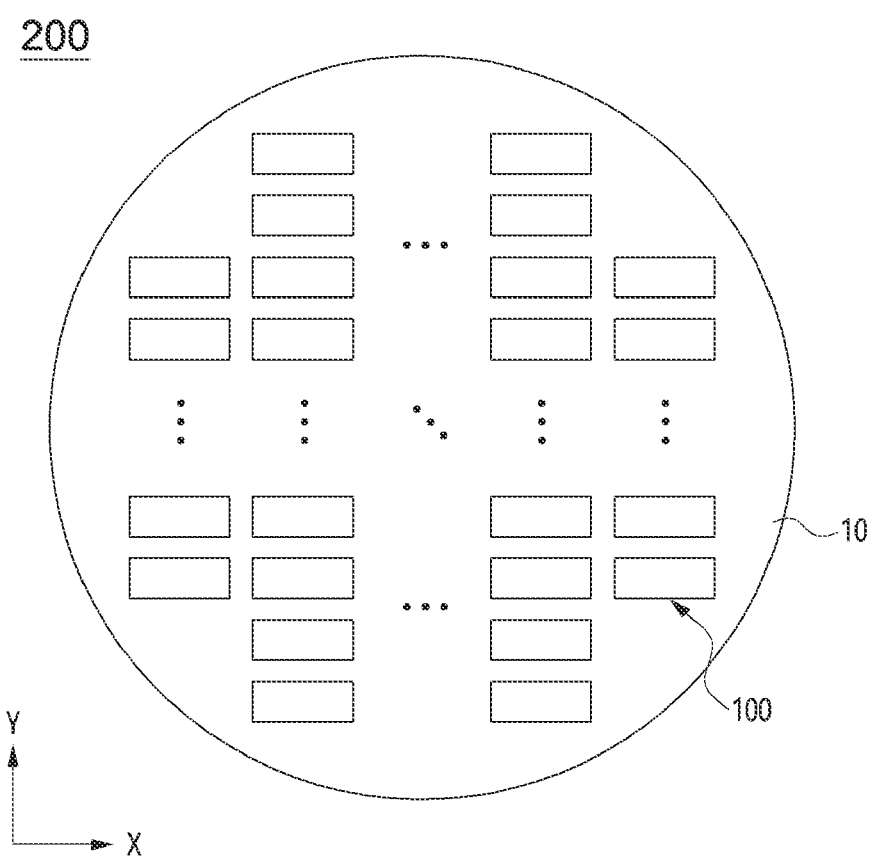
FIG. 2 is a plan view illustrating a plurality of test devices in accordance with example embodiments.

FIG. 2 is a plan view illustrating a plurality of test devices in accordance with example embodiments. For definite understanding, a device region corresponding to one test device 100 may be represented by a solid line in FIG. 2.

Referring to FIG. 2, the test device 100 of example embodiments may be a separated or individual structure on an additional semiconductor substrate 10 (hereinafter, test substrate 10) for distinguishing the test device 100 from the memory device 100a. A plurality of the test devices 100 may be provided to the semiconductor substrate 10 to form a test substrate 10. For example, the test devices 100 may be arranged on the test substrate 10 in a first direction corresponding to an x-direction in FIG. 2 to form a plurality of columns. In FIG. 2, the test devices 100 may be arranged on the semiconductor substrate 10 in a second direction, corresponding to a y-direction, intersecting with the first direction to form a plurality of rows. This arrangement may be an example for forming a sufficient amount of the test devices 100 on the semiconductor substrate 10, but is the disclosure is not limited thereto.

When the test devices 100 is provided to the test substrate 10, results of effective work functions determined in the test devices 100 may be obtained to improve accuracy and reliability in determining the effective work function, but the disclosure is not limited thereto. For example, one test device 100 may be provided to the semiconductor substrate 10.

As mentioned above, the memory device 100a of example embodiments may have the vertical structure. In contrast, a test memory device (not shown) in the test device 100 may have a planar structure. Thus, the test memory device may have a simple structure to simplify a process for manufacturing the test device 100. Further, the planar structure of the test device 100 may be more appropriate for measuring a capacitance required for determining the effective work function. Considered the structural difference between the memory device 100a and the test memory device in the test device 100, the test device 100 may be formed on the test substrate 10, which is different from the base substrate 12a, with the memory device 100a.

However, the present disclosure is not restricted to the above-mentioned structure. Thus, the test device 100 may be formed on a region of the base substrate 12a with the memory device 100a.

Figure 3:
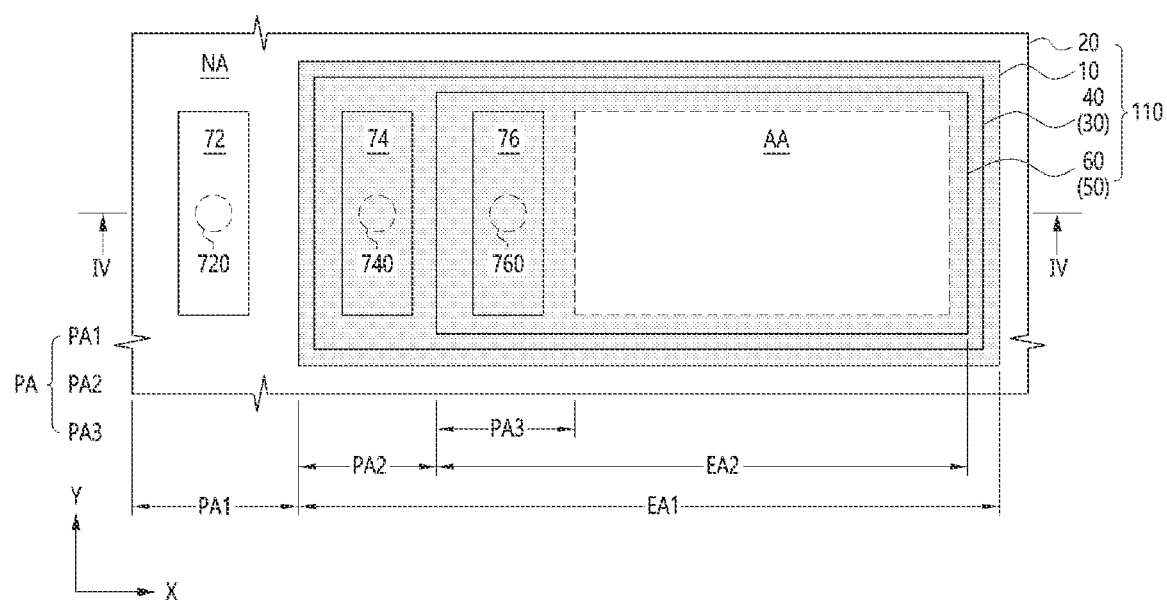
FIG. 3 is an enlarged plan view illustrating the test device in FIG. 2.
Figure 4:
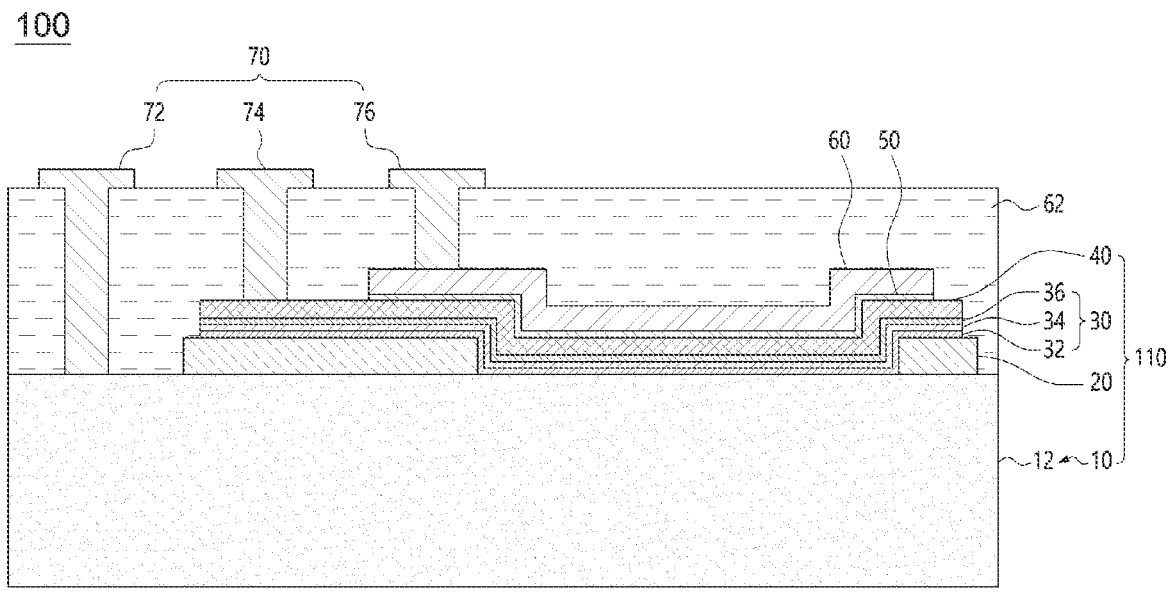
FIG. 4 is a cross-sectional view taken along a line IV-IV' in FIG. 3.

FIG. 3 is an enlarged plan view illustrating the test device in FIG. 2 and FIG. 4 is a cross-sectional view taken along a line IV-IV' in FIG. 3.

Referring to FIGS. 1 to 4, the test device 100 of example embodiments may include a test memory device 110, an insulation layer 50, and a charge injection electrode 60. The test memory device 110 may be arranged on a test substrate 10. The insulation layer 50 may be arranged on the test memory device 110. The charge injection electrode 60 may be arranged on the insulation layer 50 to inject a charge into the test memory device 110 based on a voltage applied to the charge injection electrode 60. For example, the test memory device 110 may include the test substrate 10, a test memory layer 30 on the test substrate 10, and a test gate electrode layer 40 on the test memory layer 30.

In example embodiments, the test substrate 10 may include a semiconductor material. Particularly, the test substrate 10 may include a semiconductor material substrate 12 including a semiconductor material. For example, the semiconductor material substrate 12 may include a silicon substrate, a compound semiconductor substrate, etc. The semiconductor material substrate 12 may include a single crystalline silicon wafer. The semiconductor material substrate 12 including the single crystalline silicon wafer may have good electrical characteristics. The semiconductor material substrate 12 may include a material substantially the same as a material of the base substrate 12a or the semiconductor channel layer 10a in the memory device 100a. Thus, the test memory device 110 may have characteristics similar to those of the memory device 100a.

When the test substrate 10 includes the semiconductor material substrate 12, the test device 100 may be formed using the semiconductor material substrate 12 without an additional semiconductor layer to simplify the structure and the process, but the disclosure is not limited thereto.

As mentioned above, a plurality of device regions for the test devices 100 may be defined on the test substrate 10. The test devices 100 may be positioned in the device regions. An active region AA and an inactive region NA may be defined in each of the device regions. The active region AA may be an actual test region for determining the effective work function. The inactive region NA may include a pad region PA. The pad region PA may include a first pad region PA1, a second pad region PA2, and a third pad region PA3. The first pad region PA1 may be used for a first pad 72 electrically connected to the test substrate 10. The second pad region PA2 may be used for a second pad 74 electrically connected to the gate electrode layer 40. The third pad region PA3 may be used for a third pad 76 electrically connected to the charge injection electrode 60.

The first pad region PA1 and a first effective region EA1 may be defined on the test substrate 10 in each of the device regions. The first pad region PA1 may be connected to the first pad 72. The memory layer 30 and the gate electrode layer 40 may be positioned in the first effective region EA1. Particularly, an edge portion of the first effective region EA1 may be defined by an outer edge portion of an isolation portion 20 in which the memory layer 30 and the gate electrode layer 40 may be positioned. The first effective region EA1 may include the active region AA and the second and third pad regions PA2 and PA3 so that the first effective region EA1 may have a relatively large area. The first pad region PA1 may be positioned at one side of the first effective region EA1. The first pad region PA1 may have smaller area than the first effective region EA1 because the first pad region PA1 may be connected to the first pad 72.

The isolation portion 20 may be formed on the test substrate 10 in the first effective region EA1. The isolation portion 20 may be configured to expose the first pad region PA1. The isolation portion 20 may be formed in the first effective region EA1 except for the active region AA. Thus, the isolation portion 20 may be formed in a region including the second and third pad regions PA2 and PA3.

For example, the active region AA may have the area in the first effective region EA1. The isolation portion 20 may be configured to wholly surround an edge portion of the active region AA. Thus, when the isolation portion 20 has a frame shape configured to surround an entirety of the active region AA, the active region AA may be a closed space due to the isolation portion 20, in a planar view, to definitely define the active region AA. When a passivation layer 62 is not provided, a probe of a measurement device for measuring a voltage and a capacitance of the test device 100 may undesirably penetrate through the second and third pads 74 and 76 to the test substrate 10. In this case, the test device 100 may be damaged to a point that the test device 100 cannot be used any more. However, the isolation portion 20 may effectively prevent the probe from penetrating the second and third pads 74 and 76 to the test substrate 10.

The isolation portion 20 may include material non-affecting operations related to determining the effective work function of the test device 100, for example, applying a voltage to the test memory device 100, measuring a capacitance of the test memory device 110, etc. For example, isolation portion 20 may include an insulation material, such as oxide, nitride, etc., to have stable insulation characteristics. The isolation portion 20 may include silicon oxide so that the isolation portion 20 may have good insulation characteristic and the isolation portion 20 may be formed through a simple process.

The isolation portion 20 may have a thickness for dividing and partitioning the active region AA. For example, the thickness of the isolation portion 20 may be no less than about 50 nm, for example, about 100 nm to about 500 nm. When the thickness of the isolation portion 20 is below about 100 nm, the function of the isolation portion 20 might not be sufficiently performed. In contrast, when the thickness of the isolation portion 20 is above about 500 nm, a process time may be lengthened. Further, the memory layer 30, the gate electrode layer 40, and the charge injection electrode 60 on the isolation portion 20 may have low structural stability.

In example embodiments, the isolation portion 20 may not be an indispensable element. Thus, the isolation portion 20 may be omitted. Further, the shape, the thickness, etc., of the isolation portion 20 may be various changed.

The memory layer 30 and the gate electrode layer 40 may be formed on the test substrate 10 and the isolation portion 20 in the first effective region EA1. Particularly, the memory layer 30 may be formed on the test substrate 10 in the active region AA. The memory layer 30 may be formed on a side surface and an upper surface of the isolation layer 20 in a region except for the active region AA. The gate electrode layer 40 may be formed on the memory layer 30. The gate electrode layer 40 may have a planar shape substantially the same as or similar to that of the memory layer 30 to cover the memory layer 30.

The isolation portion 20, the memory layer 30 and the gate electrode layer 40 may be positioned only in the first effective region EA1. In contrast, the isolation portion 20, the memory layer 30, and the gate electrode layer 40 might not be formed in the first pad region PA1. Thus, the test substrate 10 in the first pad region PA1 may be exposed. The first pad 72 connected to the first pad region PA1 may be stably formed without interference of the memory layer 30 and the gate electrode layer 40.

The test memory device 110 may have characteristics corresponding to those of the memory device 100a for determining the effective work function of the gate electrode 40a in the memory device 100a. That is, the memory layer 30 of the test memory device 110 may have characteristics substantially the same as or similar to those of the memory layer 30a of the memory device 100a.

Particularly, the memory layer 30 of the test memory device 110 may include a tunnel insulation layer 32, a charge storage layer 34, and a blocking insulation layer 36 sequentially formed on the test substrate 10 corresponding to the memory layer 30a of the memory device 100a. In example embodiments, the tunnel insulation layer 32, the charge storage layer 34, and the blocking insulation layer 36 may be substantially parallel to the test substrate 10 in the active region AA. The gate electrode layer 40 may also be substantially parallel to the test substrate 10 in the active region AA. Therefore, the test memory device 110 may have a planar structure.

The tunnel insulation layer 32 of the test memory device 110 may include a material having a composition substantially the same as those of the tunnel insulation layer 32a of the memory device 100a. The charge storage layer 34 of the test memory device 110 may include a material having a composition substantially the same as those of the charge storage layer 34a of the memory device 100a. The blocking insulation layer 36 of the test memory device 110 may include a material having a composition substantially the same as those of the blocking insulation layer 36a of the memory device 100a.

The tunnel insulation layer 32 of the test memory device 110 may have a thickness substantially the same as those of the tunnel insulation layer 32a of the memory device 100a. The charge storage layer 34 of the test memory device 110 may have a thickness substantially the same as those of the charge storage layer 34a of the memory device 100a. The blocking insulation layer 36 of the test memory device 110 may have a thickness substantially the same as those of the blocking insulation layer 36a of the memory device 100a. The same thickness may mean that a thickness ratio of a thin layer with respect to a thickness of a thick layer may be within about 10%.

This may be determined in accordance with directly affecting the material and the thickness of the memory layer 30a on the characteristics of the memory device 100a. Further, although the memory device 100a including a vertical structure might not directly correspond to the planar test memory device 110, the structure including the memory layer 30a on the semiconductor channel layer 10a may be substantially the same as the structure including the memory layer 30 on the test substrate 10. Thus, it might not be difficult to form the tunnel insulation layer 32 having substantially the same material and thickness as the material and thickness of the tunnel insulation layer 32a, the charge storage layer 34 having substantially the same material and thickness as the material and thickness of the charge storage layer 34a and the blocking insulation layer 36 having substantially the same material and thickness as the material and thickness of the blocking insulation layer 36.

For example, the tunnel insulation layer 32 of the test memory device 110 may be formed through a process using an apparatus under a condition substantially the same as those for forming the tunnel insulation layer 32a of the memory device 100a. The charge storage layer 34 of the test memory device 110 may be formed through a process using an apparatus under a condition substantially the same as those for forming the charge storage layer 34a of the memory device 100a. The blocking insulation layer 36 of the test memory device 110 may be formed through a process using an apparatus under a condition substantially the same as those for forming the blocking insulation layer 36a of the memory device 100a. Thus, the process for manufacturing the test memory device 110 may be simplified to provide the test memory device 110 with the characteristics substantially the same as or similar to the characteristics of the memory device 100a. As a result, the accuracy and the reliability of the determination for the effective work function of the gate electrode 40a in the memory device 100a may be improved.

In example embodiments, the tunnel insulation layer 32 or 32a may include oxide, nitride, etc. For example, the tunnel insulation layer 32 or 32a may include oxide. Thus, the tunnel insulation layer 32 or 32a may be easily formed. Further, the tunnel insulation layer 32 or 32a may have good characteristics. Particularly, the tunnel insulation layer 32 or 32a may include silicon oxide, for example, dioxide silicon (SiO2).

The charge storage layer 34 or 34a may include nitride, for example, a high-k material, such as silicon nitride (Si3N4).

The blocking insulation layer 36 or 36a may provide a potential barrier. The blocking insulation layer 36 may include a material having a work function higher than a work function of the charge storage layer 34 or 34a. For example, the blocking insulation layer 36 or 36a may include oxide, such as aluminum oxide (Al2O5), silicon oxide (SiO2), etc.

In example embodiments, the thickness of the memory layer 30a in the memory device 100a may function as the memory layer 30a. The thickness of the memory layer 30 in the test memory device 110 may be substantially the same as the thickness of the memory layer 30a. For example, the thickness of the memory layer 30 or 30a may be less than the thickness of the semiconductor channel layer 10a or the test substrate 10, the thickness of the gate electrode layer 40 or 40a, and the thickness of the charge injection layer 60. The thickness of the memory layer 30 or 30a may be greater than the thickness of the insulation layer 50. For example, the thickness of the memory layer 30 or 30a may be about 10 nm to about 50 nm, but the disclosure is not limited thereto.

The gate electrode layer 40 on the memory layer 30 may have characteristics substantially the same as or similar to those of the gate electrode 40a for determining the effective work function of the gate electrode 40a in the memory device 100a. Thus, the gate electrode layer 40 of the test memory device 110 may include a material substantially the same as the material of the gate electrode 40a of the memory device 100a. The gate electrode 40 or 40a may include a conductive material, such as a metal, for example, copper, but the disclosure is not limited thereto.

The thickness of the gate electrode layer 40 of the test memory device 110 may be substantially the same as, less than, or greater than the thickness LT of the gate electrode 40a in the memory device 100a because the thickness of the gate electrode 40 or 40a might not directly affect the effective work function. The thickness of the gate electrode 40 may be measured in a vertical direction in relation to the test substrate 10. The thickness LT of the gate electrode 40a may be a thickness of the gate electrode 40a in a vertical direction (a vertical direction in FIG. 1) in relation to the base substrate 12a.

The thickness T of the gate electrode 40a affecting the semiconductor channel layer 10a in operating the memory device 100a may be a length of the gate electrode 40a in a vertical direction (a horizontal direction in FIG. 1) in relation to the semiconductor channel layer 10a. The thickness of the gate electrode layer 40a in the test device 100 may be less than the thickness T of the gate electrode 40a in the memory device 100a.

The thickness of the gate electrode layer 40 may be greater than the thickness of the memory layer 30. The thickness of the gate electrode layer 40 may be less than the thickness of the semiconductor substrate 10, the charge injection electrode 60, or the first to third pads 72, 74, and 76. The thick thicknesses of the semiconductor substrate 10, the charge injection electrode 60, and the first to third pads 72, 74, and 76 may perform the functions of the semiconductor substrate 10, the charge injection electrode 60, and the first to third pads 72, 74, and 76. When the gate electrode 40 has a very thick thickness, the thick gate electrode 40 may interrupt an approach of the charge from the charge injection electrode 60 to the test memory device 110 through the gate electrode layer 40. Thus, the gate electrode layer 40 may have a thin thickness to prevent the movement of the charge injected from the charge injection electrode 60 from being interrupted.

Alternatively, the thickness of the gate electrode layer 40 may be about 20 nm to about 80 nm, for example, about 20 nm to about 50 nm. When the gate electrode layer 40 has a very thin thickness, the thin gate electrode layer 40 might not function as an electrode. In contrast, when the gate electrode layer 40 has a very thick thickness, the thick gate electrode layer 40 may interrupt the movement of the charge through the charge injection electrode 60, but the disclosure is not limited thereto.

In example embodiments, the gate electrode layer 40 of the test memory device 110 may be formed through a process using an apparatus under a condition substantially the same as those for forming the gate electrode 40a of the memory device 100a. The thickness of the gate electrode layer 40 may be controlled to a desired thickness by changing a process time, but the disclosure is not limited thereto.

The second pad region PA2 and a second effective region EA2 may be defined on the gate electrode layer 40 in the second effective region EA1 of each of the device regions. The second pad region PA2 may be connected to the second pad 74. The insulation layer 50 and the charge injection electrode 60 may be positioned in the second effective region EA2. The second effective region EA2 may include the active region AA and the third pad region PA3 so that the second effective region EA2 may have a relatively large area. The second pad region PA2 may be positioned at one side of the second effective region EA2 between the second effective region EA2 and the first pad region PA1. The second pad region PA2 may have a smaller area than the second effective region EA2 because the second pad region PA2 may be connected to the second pad 74.

The insulation layer 50 and the charge injection electrode 60 may be formed on the gate electrode layer 40 in the second effective region EA2. Particularly, the insulation layer 50 may be formed on the memory layer 30 and the gate electrode layer 40, substantially parallel to the test substrate 10 in the active region AA. The insulation layer 50 and the charge injection electrode 60 may be formed on the memory layer 30 and the gate electrode layer 40 over the side surface and the upper surface of the isolation portion 20 in a region except for the active region AA. The charge injection electrode 60 may be formed on the insulation layer 60. The charge injection electrode 60 may have a planar shape, substantially the same as or similar to that of the insulation layer 50, to cover the insulation layer 50.

The insulation layer 50 and the charge injection electrode 60 may be positioned only in the second effective region EA2. In contrast, the isolation layer 50 and the charge injection electrode 60 might not be formed in the second pad region PA2. Thus, the gate electrode layer 40 in the second pad region PA2 may be exposed. The second pad 74 connected to the second pad region PA2 may be stably formed without interference of the insulation layer 50 and the charge injection electrode 60.

In example embodiments, the insulation layer 50 may include various materials having insulation characteristics. For example, the insulation layer 50 may include oxide, nitride, etc. Particularly, the insulation layer 50 may include silicon oxide. The insulation layer 50 may function as a tunneling layer through which the charge injected by the charge injection electrode 60 may tunnel. When the insulation layer 50 includes the silicon oxide, a process may be simplified and the insulation layer 50 may have improved tunneling characteristics, but the disclosure is not limited thereto.

As mentioned above, because the insulation layer 50 may function as the tunneling layer, the insulation layer 50 may have a thin thickness for allowing the charge injected by the charge injection electrode 60 to be smoothly moved. Thus, the thickness of the insulation layer 50 may be less than the thickness of the memory layer 30. For example, the thickness of the insulation layer 50 may be less than the thickness of the tunnel insulation layer 32, the thickness of the charge storage layer 34, and the thickness of the blocking insulation layer 36 in the memory layer 30. The thickness of the insulation layer 50 may be about 30% to about 80% of the thicknesses of the tunnel insulation layer 32, the charge storage layer 34, and the blocking insulation layer 36. For example, the thickness of the insulation layer 50 may be about 0.1 nm to about 3 nm. This thickness may be determined for allowing the smooth movement of the charge, but the disclosure is not limited thereto.

The charge injection electrode 60 on the insulation layer 50 may move the charge toward the test memory device 110 by applying a voltage. The charge injection electrode 60 may be referred to as an emitter. Particularly, the charge injection electrode 60 may be an electron injection electrode for injecting an electron. In example embodiments, the charge injection electrode 60 may be the electron injection electrode, but the disclosure is not limited thereto. Alternatively, the charge injection electrode 60 may be an electron-hole injection electrode.

The charge injection electrode 60 may include various materials, for example, a metal configured to perform the above-mentioned functions. For example, the material of the charge injection electrode 60 may have a work function substantially equal to or greater than the work function of the gate electrode layer 40. Thus, when a high voltage is not applied to the charge injection electrode 60, the charge may be easily moved. For example, the charge injection electrode 60 may include gold, tungsten, etc., having a relatively high work function. Alternatively, the charge injection electrode 60 may include a material, such as copper, substantially the same as the material of the gate electrode layer 40. When the material of the charge injection electrode 60 is substantially the same as the material of the gate electrode layer 40, the charge injection electrode 60 may be formed using an apparatus for forming the gate electrode layer 40 to simplify the process for manufacturing the test device 100.

However, the prevent invention is not restricted to the above-mentioned illustrations. For example, although the work function of the charge injection electrode 60 may be less than the word function of the gate electrode layer 40, a sufficient voltage may be applied to the charge injection electrode 60 to move the charge toward the test memory device 110. Therefore, the charge injection electrode 60 may include various metals, such as aluminum, silver, etc.

The charge injection electrode 60 may have various thicknesses, for example, about 50 nm to about 300 nm. This thickness may allow the function of the charge injection electrode 60 without increasing the process time, but the disclosure is not limited thereto.

The third pad region PA3 and the active region AA may be defined on the charge injection electrode 60 in the second effective region EA2 of each of the device regions. The third pad region PA3 may be connected to the third pad 76. The third pad region PA3 may be positioned at one side of the active region AA between the active region AA and the second pad region PA2. The third pad region PA3 may have an area smaller than the area of the active region AA because the area of the third pad region PA3 may be merely connected to the third pad 76.

A passivation layer 62 may be formed on the semiconductor substrate 10, the isolation portion 20, the memory layer 30, the gate electrode layer 40, the insulation layer 50 and the charge injection electrode 60. The passivation layer 62 may be divided into a plurality of portions corresponding to each of the device regions. Alternatively, the passivation layer 62 may be formed through a simple process to cover a plurality of the device regions. The passivation layer 62 may include various materials capable of planarizing a lower uneven portion and having insulation characteristics. For example, the passivation layer 62 may include oxide, nitride, etc., particularly, silicon oxide, but the disclosure is not limited thereto. Further, the passivation layer 62 may be omitted.

A first contact hole 720, a second contact hole 740 and a third contact hole 760 may be formed through the passivation layer 62. The first contact hole 720 may correspond to the first pad region PA1. The second contact hole 740 may correspond to the second pad region PA2. The third contact hole 760 may correspond to the third pad region PA3. The first pad 72, the second pad 74, and the third pad 76 may be formed on the passivation layer 62. The first pad 72 may be connected to the first pad region PA1. The second pad 74 may be connected to the second pad region PA2. The third pad 76 may be connected to the third pad region PA3.

The first contact hole 720 may be formed through the passivation layer 62 to expose the semiconductor substrate 10 in the first pad region PA1. The first pad 72 on the passivation layer 62 may be formed in the first contact hole 720 to be physically and electrically connected to the test substrate 10. The second contact hole 740 may be formed through the passivation layer 62 to expose the gate electrode layer 40 in the second pad region PA2. The second pad 74 on the passivation layer 62 may be formed in the second contact hole 740 to be physically and electrically connected to the gate electrode layer 40. The third contact hole 760 may be formed through the passivation layer 62 to expose the charge injection electrode 60 in the third pad region PA3. The third pad 76 on the passivation layer 62 may be formed in the third contact hole 760 to be physically and electrically connected to the charge injection electrode 60.

An external measurement device may be connected with the first pad 72, the second pad 74, and the third pad 76 to apply a desired voltage to the semiconductor substrate 10, the gate electrode layer 40, and the charge injection electrode 60 and may measure the capacitance. The first pad 72, the second pad 74 and the third pad 76 may include a conductive material, such as a metal appropriate to the voltage applying. The first pad 72, the second pad 74 and the third pad 76 may include a material substantially the same as or different from the material of the gate electrode layer 40 and/or the charge injection electrode 60. For example, the first pad 72, the second pad 74, and the third pad 76 may be formed using an apparatus for forming the gate electrode layer 40 and/or the charge injection electrode 60. Thus, the process for forming the test device 100 may be simplified.

In example embodiments, the first pad 72, the second pad 74, and the third pad 76 may be formed through the same process to have the same material and the same composition, but the disclosure is not limited thereto.

In example embodiments, the first pad region PA1, the second pad region PA2, and the third pad region PA3 may be sequentially arranged at one side of the test device 100. The active region AA may be positioned at the other side of the test device 100. Connection structures of the first pad 72, the second pad 74, and the third pad 76 may be simplified to provide the test device 100 with a simple structure. In this case, the test device 100 may have a rectangular shape having a relatively long length in the first direction (the x-direction in FIG. 2) and a relatively short length in the second direction (the y-direction in FIG. 2), but the disclosure is not limited thereto. The planar shape of the test device 100 and the planar shape, the arrangement, and the structure of the first to third pad regions PA1, PA2, and PA3 may be variously changed.

In FIG. 3, the first pad 72, the second pad 74, and the third pad 76 may have a quadrangular shape corresponding to the first pad region PA1, the second pad region PA2, and the third pad region PA3, respectively. The first pad 72, the second pad 74, and the third pad 76 may have sufficiently large areas to which the external measurement device may be accurately connected, but the disclosure is not limited thereto. The planar shape, the arrangement and the structure of the first to third pads 72, 74, and 76 may be variously changed.

Further, in FIG. 3, the first contact hole 720, the second contact hole 740, and the third contact hole 760 may be a single central hole and may have a planar circular shape, but the disclosure is not limited thereto. For example, the first to third contact holes 720, 740, and 760 may have a polygonal shape, an elliptical shape, etc. Further, each of the first to third contact holes 720, 740, and 760 may include a plurality of holes.

Hereinafter, a method of manufacturing the test device 100 in accordance with example embodiments may be illustrated. Any further illustrations with respect to the above-mentioned portions has been omitted herein for brevity.

The isolation portion 20 may be formed on the semiconductor substrate 10. The isolation portion 20 may have a desired patterned shape. Alternatively, after the isolation portion 20 has been entirely formed, the isolation portion 20 may be patterned. The isolation portion 20 may be formed through well-known processes, but the disclosure is not limited thereto. Further, the process for forming the isolation portion 20 may be omitted.

The memory layer 30 and the gate electrode layer 40 may be sequentially formed on the test substrate 10 and the isolation portion 20. The memory layer 30 may be formed through a process substantially the same as the process for forming the memory layer 30a of the memory device 100a. The gate electrode layer 40 may be formed through a process substantially the same as the process for forming the gate electrode 40a of the memory device 100a. The memory layer 30 of the test device 100 may have a thickness substantially the same as the thickness of the memory layer 30a in the memory device 100a. The thickness of the gate electrode layer 40 in the test device 100 may be substantially equal to, less than, or greater than the thickness LT of the gate electrode 40a in the memory device 100a. The thickness of the gate electrode layer 40 in the test device 100 may be less than the thickness T of the gate electrode 40a in the memory device 100a.

The memory layer 30 and/or the gate electrode layer 40 may have a desired pattern. Alternatively, after wholly forming the memory layer 30 and the gate electrode layer 40, the memory layer 30 and the gate electrode layer 40 may then be patterned. When the memory layer 30 and the gate electrode layer 40 is patterned, the memory layer 30 and the gate electrode layer 40 may be simultaneously patterned, or the memory layer 30 may be patterned after patterning the gate electrode layer 40.

The insulation layer 50 may be formed on the memory layer 30 and the gate electrode layer 40, i.e., the test memory device 110. The insulation layer 50 may be formed through well-known processes. For example, when the memory device 100a includes silicon oxide, the insulation layer 50 may be formed using an apparatus for forming silicon oxide to simplify the process.

The charge injection electrode 60 may be formed on the insulation layer 50. The charge injection electrode 60 may be formed through well-known processes. For example, the charge injection electrode 60 may be formed using an apparatus for forming the gate electrode layer 40.

The insulation layer 50 and/or the charge injection electrode 60 may have desired patterns. Alternatively, after wholly forming the insulation layer 50 and the charge injection electrode 60, the insulation layer 50 and the charge injection electrode 60 may then be patterned. When the insulation layer 50 and the charge injection electrode 60 are patterned, the insulation layer 50 and the charge injection electrode 60 may be simultaneously patterned, or the insulation layer 50 may be patterned after patterning the charge injection electrode 60.

The passivation layer 62 having the first to third contact holes 720, 740, and 760 may then be formed. The first contact pad 72, the second contact pad 74 and the third contact pad 76 may be formed in the first contact hole 720, the second contact hole 740, and the third contact hole 760, respectively. The passivation layer 62 having the first to third contact hole 720, 740, and 760 may be formed. Alternatively, after forming the passivation layer 62, the first contact hole 720, the second contact hole 740, and the third contact hole 760 may be formed through the passivation layer 62 through an etching process. The first to third pads 72, 74, and 76 may have patterns. Alternatively, after forming the first to third pads 72, 74, and 76 on the passivation layer 62, a patterning process may be performed to form the first to third pads 72, 74, and 76.

In the test device 100, the insulation layer 50 and the charge injection electrode 60 may be arranged on the test memory device 110 to determine the effective work function of the gate electrode 40a in the memory device 100a. Particularly, the capacitance of the test memory device 110 having the metal-oxide-semiconductor capacitor structure may be measured to determine the effective work function of the gate electrode layer 40 of the test memory device 110, thereby determining the effective work function of the gate electrode 40a of the memory device 100a.

Therefore, the effective work function of the gate electrode 40a in the memory device 100a may be determined using the non-optical method. The test device 100 having the test pattern may be formed on the semiconductor substrate 100, such as the wafer, to determine the effective work function of the gate electrode 40a with attaching the gate electrode 40a to the blocking insulation layer 36a. As a result, the effective work function of the gate electrode 40a may be simply and accurately determined under the condition that the gate electrode 40a may be attached to the blocking insulation layer 36a.

In the method of manufacturing the test device 100, the test device 100 may be manufactured using the process and/or the apparatus for manufacturing the memory device 100a. Thus, the test device 100 including the test memory device 110, which may have characteristics substantially equal to or similar to those of the memory device 100a, may be manufactured. That is, the test device 100 used for accurately determining the effective work function of the gate electrode 40a in the memory device 100a may be manufactured through a simple process.

The test device 100 may be used for measuring or determining the effective work function of the gate electrode 40a in the memory device 100a. Reasons for an effective work function of the gate electrode 40a in the memory device 100a may be as follows.

The effective work function of the gate electrode 40a in the memory device 100a may correspond to an energy barrier between the Fermi level of the gate electrode 40a and the conduction band of the blocking insulation layer 36a. That is, the effective work function of the gate electrode 40a in the memory device 100a may correspond to the energy barrier eWF in FIG. 5 between the Fermi level of the gate electrode layer 40 and the conduction band of the blocking insulation layer 36. When the effective work function of the gate electrode 40a in the memory device 100a is high, a back tunneling of the electron in an erase operation may be reduced. The back tunneling may mean that the charge, for example, the electron may be moved over the energy barrier between the gate electrode 40a and the blocking insulation layer 36a when the voltage is applied to the gate electrode 40a in the erase operation. When the back tunneling is generated, a minimum value of a threshold voltage VT represented by an erase saturation voltage in the erase operation may be increased to deteriorate erase characteristics.

That is, when the gate electrode 40a has a high effective work function to reduce the back tunneling, the minimum value of the threshold voltage in the erase operation may be decreased. A program/erase window may be defined by a difference between a maximum value of the threshold voltage in the program operation and the minimum value of the threshold voltage in the erase operation. A management performance of data in the memory device 100a may be improved in proportion to increasing the program/erase window. When the effective work function of the gate electrode 40a is high, the minimum value of the threshold voltage in the erase operation may be decreased to increase the program/erase window. Thus, because the effective work function of the gate electrode 40a may be a factor related to the operation of the memory device 100a, particularly, the erase operation, the effective work function of the gate electrode 40a may be determined to recognize the characteristics of the memory device 100a.

Therefore, when the material or the composition of the gate electrode 40a in the memory device 100a is changed or the process for forming the gate electrode 40a is changed, it may be required to measure or determine the effective work function of the gate electrode 40a in order to predict the characteristic changes of the memory device 100a. In a conventional art, the work function of each of materials may be measured. However, after forming the memory device 100a to attach the gate electrode 40a to the blocking insulation layer 36a, the effective work function of the gate electrode 40a might not be measure or determined.

That is, even though the effective work function of the gate electrode 40a under the condition that the gate electrode 40a may be attached to the blocking insulation layer 36a may be the important factor affecting the characteristics of the memory device 100a, it may be difficult to measure or determine the effective work function of the gate electrode 40a using the conventional art. In contrast, according to example embodiments, the test device 100 used for determining the effective work function of the gate electrode 40a in the memory device 100a may be proposed.

A principle for determining the effective work function of the gate electrode 40a in the memory device 100a using the test device 100 may be illustrated in detail with reference to FIGS. 1 to 9. FIGS. 5 to 9 may schematically show for the definite understanding, but the disclosure is not limited thereto. Further, the electron may be the charge injected by the charge injection electrode 60, but the disclosure is not limited thereto.

Figure 5:
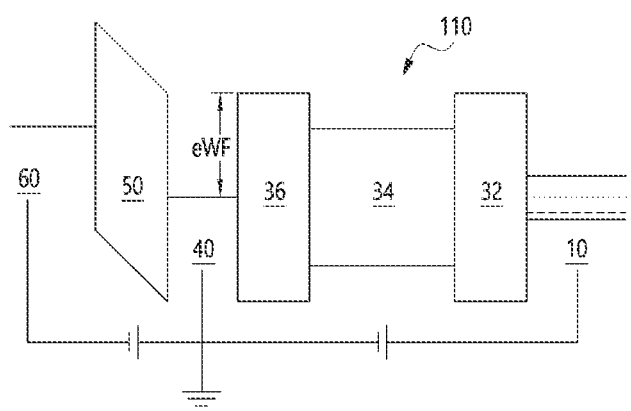
FIG. 5 is a view illustrating a band diagram and an electrical connection structure of a test device when a voltage is not applied to a charge injection electrode in accordance with example embodiments.
Figure 6:
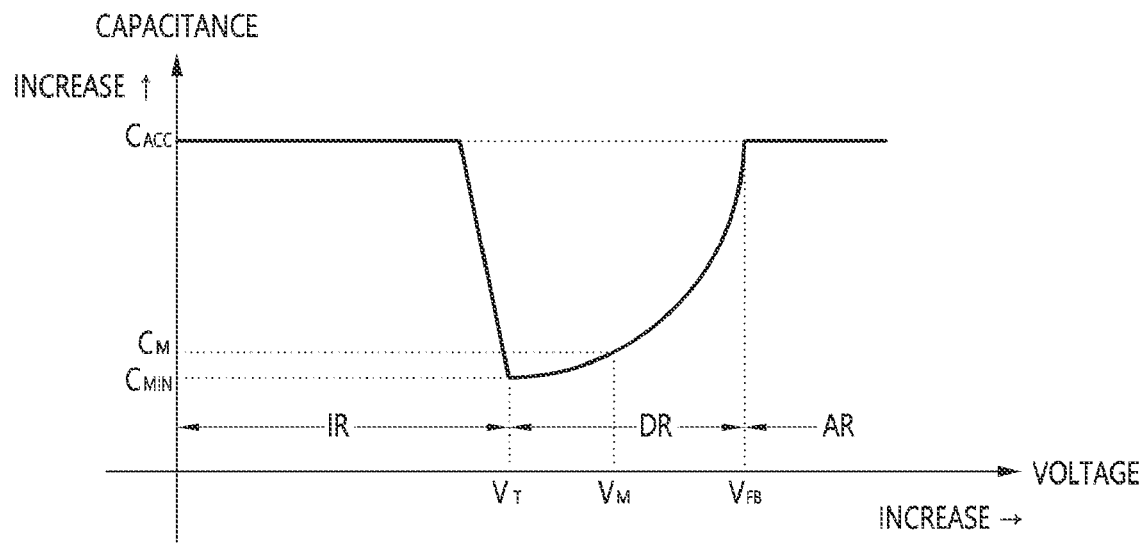
FIG. 6 is a view illustrating a curve of a reference voltage (C) and capacitance (V) in a test device when a voltage is not applied to a charge injection electrode in accordance with example embodiments.

FIG. 5 is a view illustrating a band diagram and an electrical connection structure of a test device when a voltage is not applied to a charge injection electrode in accordance with example embodiments and FIG. 6 is a view illustrating a curve of a reference voltage (V) and capacitance (C) in a test device when a voltage is not applied to a charge injection electrode in accordance with example embodiments. Hereinafter, the characteristics of the gate electrode 40a in the memory device 100a may be determined using the test memory device 110 as a reference based on results with respect to the gate electrode layer 40 of the test memory device 110. Thus, illustrations of the gate electrode layer 40 and the test memory device 110 may be applied to the gate electrode 40a and the memory device 100a.

Referring to FIG. 5, the effective work function eWF of the gate electrode 40 in the test memory device 110 may correspond to the energy level difference between the Fermi level of the metal in the gate electrode 40 and the conduction band of the oxide in the blocking insulation layer 36. The test memory device 110 of example embodiments may be the metal-oxide-silicon capacitor. Thus, as shown in FIG. 6, when the voltage is not applied to the charge injection electrode 60, a reference C-V curve may have an accumulation region AR, a depletion region DR, and an inverse region IR in accordance with the voltage. Voltages along the X-axis in FIG. 6 may be a voltage between the semiconductor substrate 10 and the gate electrode layer 40, for example, a value of a voltage of the gate electrode 40 from a voltage of the semiconductor substrate 10.

When the reference C-V curve is obtained, a threshold voltage $V_T$, a flatband voltage $V_{FB}$, a minimum capacitance $C_{MIN}$, an accumulation capacitance $C_{ACC}$, etc., may also be obtained. A reference capacitance $C_M$ at a reference measurement voltage $V_M$, which may correspond to a voltage between the threshold voltage $V_T$ and the flatband voltage $V_{FB}$, greatly changed by the voltage, may also be obtained.

Figure 7:
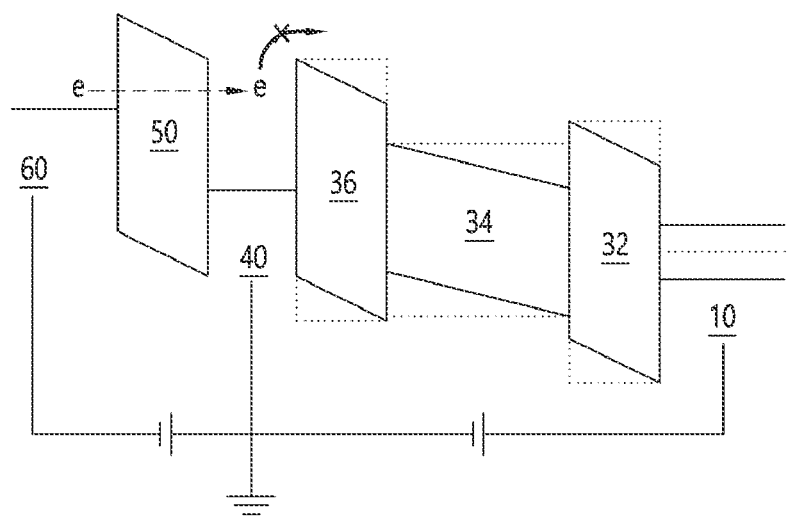
FIG. 7 is a view illustrating a band diagram and an electrical connection structure of a test device when a voltage, which is less than a voltage corresponding to an effective work function of a charge injection electrode, is applied to a charge injection electrode in accordance with example embodiments.

FIG. 7 is a view illustrating a band diagram and an electrical connection structure of a test device when a voltage, which is less than a voltage corresponding to an effective work function of a charge injection electrode, is applied to a charge injection electrode in accordance with example embodiments.

As shown in FIG. 7, when a voltage less than a voltage corresponding to the effective work function is applied to the charge injection electrode 60 of the test device 100, the electron (e) injected by the charge injection electrode 60 may tunnel through the insulation layer 50 along a dotted arrow in FIG. 7. However, as shown in a solid arrow, because the conduction band of the blocking insulation layer 50 may be high, it may be difficult to pass the electron (e) over the blocking insulation layer 50. Thus, the electron (e) might not infiltrate into the test memory device 110, for example, the charge storage layer 34, so that the C-V curve of the test memory device 110 might not be changed. Therefore, the C-V curve of the test memory device 100 may be maintained in the shape of the reference C-V curve in FIG. 6.

Figure 8:
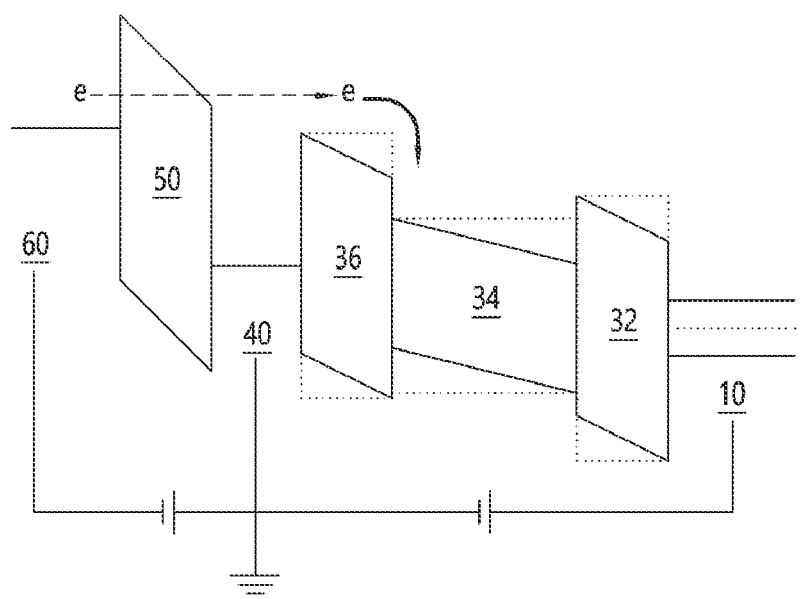
FIG. 8 is a view illustrating a band diagram and an electrical connection structure of a test device when a voltage, which is greater than a voltage corresponding to an effective work function of a charge injection electrode, is applied to a charge injection electrode in accordance with example embodiments.
Figure 9:
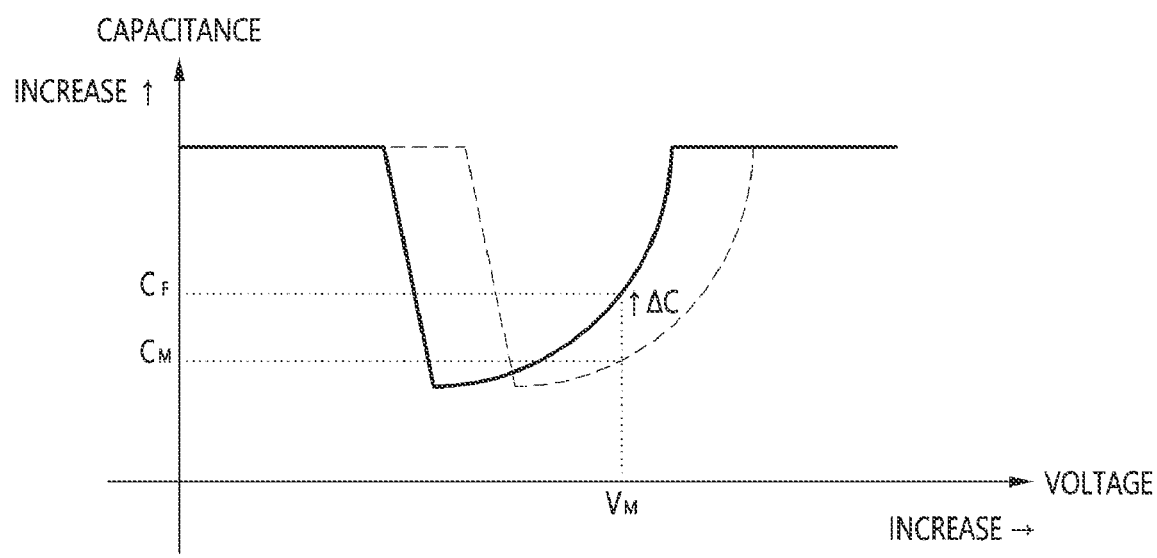
FIG. 9 is a view illustrating a C-V curve of a test memory device in a test device when a voltage, which is greater than a voltage corresponding to an effective work function of a charge injection electrode, is applied to a charge injection electrode in accordance with example embodiments.

FIG. 8 is a view illustrating a band diagram and an electrical connection structure of a test device when a voltage, which is greater than a voltage corresponding to an effective work function of a charge injection electrode, is applied to a charge injection electrode in accordance with example embodiments, and FIG. 9 is a view illustrating a C-V curve of a test memory device in a test device when a voltage, which is greater than a voltage corresponding to an effective work function of a charge injection electrode, is applied to a charge injection electrode in accordance with example embodiments.

As shown in FIG. 8, when a voltage greater than a voltage corresponding to the effective work function is applied to the charge injection electrode 60 of the test device 100, the electron (e) injected by the charge injection electrode 60 may tunnel through the insulation layer 50 along a dotted arrow in FIG. 8. Further, the electron (e) may pass over the conduction band of the blocking insulation layer 36 so that the electron (e) may infiltrate into the test memory device 110, for example, the charge storage layer 34, along a solid arrow in FIG. 8. Thus, the C-V curve of the test memory device 110 may be changed into a shape in FIG. 9. For accurate comparisons, the reference C-V curve in FIG. 6 may be shown by a dotted line in FIG. 9.

That is, when the electron injected by the charge injection electrode 60 approaches into the test memory device 110 to be trapped, the C-V curve may be totally moved from left to right. Thus, the capacitance at the reference measurement voltage $V_M$ may be changed into a change capacitance $C_F$, changed from the reference capacitance $C_M$, with a difference of ΔC.

When the electron (e) approaches the test memory device 110 based on the voltage applied to the charge injection electrode 60 to change the capacitance of the test memory device 110, this may mean that the voltage applied to the charge injection electrode 50 may be substantially equal to or greater than the voltage corresponding to the effective work function of the gate electrode 40. That is, when the capacitance of the test memory device 110 is changed from the reference measurement voltage VM, by no less than a reference value, by the voltage applied to the charge injection electrode 60, it can be noted that the voltage may be substantially equal to or greater than the voltage corresponding to the effective work function of the gate electrode 40. Thus, the capacitance change of the test memory device 110 in accordance with the voltage applied to the charge injection electrode 60 may be measured to determine the effective work function of the gate electrode layer 40 in the test memory device 110. As a result, the effective work function of the gate electrode 40a in the memory device 100a may be determined.

According to example embodiments, the memory layer 30a in the memory device 100a or the memory layer 30 in the test memory device 110 may have the thickness of no less than about 10 nm. Thus, the effective work function of the gate electrode 40 or 40a might not be determined by directly flowing a current through the memory layer 30 or 30a. In contrast, because the test memory device 110 in the test device 100 may be the metal-oxide-silicon capacitor, the capacitance of the test memory device 110 may be measured by changing the voltage applied to the charge injection electrode 60. The voltage of the charge injection electrode 60 at which the capacitance change of the test memory device 110 may reach the reference value may be determined as the voltage corresponding to the effective work function of the gate electrode 40.

Hereinafter, a method of determining the effective work function of the gate electrode 40a in the memory device 100a or the gate electrode layer 40 in the test memory device 110 using the test device 100 may be illustrated in detail with reference to FIGS. 1 to 11.

Figure 10:
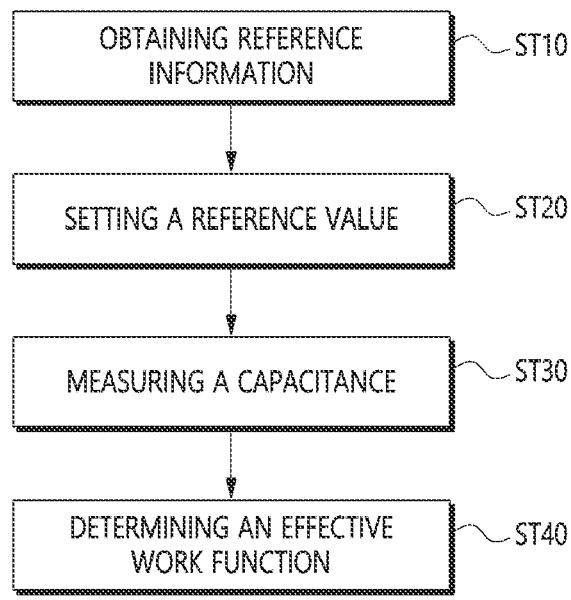
FIG. 10 is a flow chart illustrating a method of determining an effective work function in accordance with example embodiments.

FIG. 10 is a flow chart illustrating a method of determining an effective work function in accordance with example embodiments.

The method of determining the effective work function in accordance with example embodiments may include measuring the capacitance change of the test memory device 110 in accordance with the voltage applied to the charge injection electrode 60 of the test device 100 to determine the effective work function of the gate electrode layer 40 in the test device 100, thereby determining the effective work function of the gate electrode 40a in the memory device 100a.

Referring to FIG. 10, the determining method may include a step ST30 for measuring the capacitance and a step ST40 for determining the effective work function. The method may further include a step ST10 for obtaining reference information and a step ST20 for setting a reference value.

In the step ST10, the capacitance in accordance with the voltage of the test memory device 110 with the charge injection electrode 60 to which no voltage (for example 0V) is applied may be measured to obtain the reference information corresponding to the reference C-V curve in FIG. 6.

Particularly, while the charge injection electrode 60 is biased, the capacitance of the test memory device 110 in accordance with the voltage may be measured in changing the voltage between the gate electrode layer 40 and the test substrate 10. In example embodiments, a first reference voltage, for example, about 0 V, may be applied to the gate electrode layer 40. The capacitance of the test memory device 110 may be measured in changing the voltage applied to the test substrate 10. The voltage applied to the test substrate 10 may be a voltage within the accumulation region, the depletion region, and the inverse region, for example, about −7 V to about 7 V.

That is, no bias voltage may be applied to the charge injection electrode 60 through the third pad 76 (that is, the voltage may not be applied). The first reference voltage, for example, about 1V may be applied to the gate electrode 40 through the second pad 74. The capacitance of the test memory device 110 may be measured in changing the voltage applied to the semiconductor substrate 10 through the first pad 72 from about −7V to about 7V. For example, the probe of the measurement device may make contact with the first to third pads 72, 74, and 76 to apply the voltage to the pads, thereby measuring the capacitance. The measurement device may include LCR meter, B1500A, etc.

In example embodiments, the first reference voltage, for example, about 0 V may be applied to the gate electrode layer 40. The voltage applied to the semiconductor substrate 10 may be changed from about −7 V to about 7 V, but the disclosure is not limited thereto. The voltages applied to the gate electrode layer 40 and the semiconductor substrate 10 may be within a range representing the accumulation region, the depletion region, and the inverse region. Thus, the first reference voltage applied to the gate electrode layer 40 might not be about 0 V. Further, the voltage applied to the semiconductor substrate 10 might not be from about −7 V to about 7 V. Alternatively, the first reference voltage may be applied to the test substrate 10, and the voltage applied to the gate electrode layer 40 may be changed.

The threshold voltage $V_T$, the flatband voltage $V_{FB}$, the minimum capacitance $C_{MIN}$, the accumulation capacitance $C_{ACC}$, etc., may be obtained from the reference C-V curve. A reference capacitance $C_M$ at a reference measurement voltage $V_M$, which may correspond to a voltage between the threshold voltage $V_T$ and the flatband voltage $V_{FB}$, greatly changed by the voltage, may also be obtained.

In step ST20, the reference measurement voltage V M applied to the gate electrode layer 40 and the test substrate 10 in step ST30 and the reference value in step ST40 may be set using the reference C-V curve.

The reference measurement voltage V M may be the voltage between the threshold voltage $V_T$ and the flatband voltage $V_{FB}$. The voltage between the threshold voltage $V_T$ and the flatband voltage $V_{FB}$ may be region in which the capacitance of the test memory device 110 may be greatly changed in accordance with the voltage. Further, for example, the reference measurement voltage $V_M$ may be about −2 V to about 2 V. The capacitance of the test memory device 110 might not be greatly changed in accordance with the voltage within the range.

The capacitance change at the measurement voltage $V_M$ in the region in which the capacitance may be greatly changed in accordance with the voltage may be measured to accurately detect the effective work function of the gate electrode layer 40.

The reference value may have a capacitance greater than the measurement voltage $V_M$. Thus, the reference value may correspond to a capacitance change for determining a change of the capacitance. The reference value may be set by a user considering various values, shape, etc., of the reference C-V curve, but the disclosure is not limited thereto. A program, a machine, etc., may be used to analyze the reference C-V curve, thereby determining the reference measurement voltage, the reference value, etc.

For example, when a maximum change of the capacitance is a difference between the minimum capacitance $C_{MIN}$ and the accumulation capacitance $C_{ACC}$, the reference value may be set as a ratio with respect to the maximum change of the capacitance. For example, the reference value may be about 10% of the maximum change of the capacitance. The reference measurement voltage $V_M$ may be a median between the threshold voltage $V_T$ and the flatband voltage $V_{FB}$. The reference value may be about 10% of the maximum change of the capacitance, but the disclosure is not limited thereto. Further, the reference value may be a plurality of values to improve the accuracy and the reliability of the determination.

In step ST30, when the reference measurement voltage $V_M$ is applied to the gate electrode layer 40 and the test substrate 10, the capacitance of the test memory device 110 may be measured in changing the voltage applied to the charge injection electrode 60.

The applying of the reference measurement voltage $V_M$ to the gate electrode layer 40 and the test substrate 10 may mean that a voltage between the gate electrode layer 40 and the test substrate 10 may be the reference measurement voltage $V_M$. In example embodiments, the second reference voltage, for example, about 0 V, may be applied to the gate electrode layer 40, and the reference measurement voltage $V_M$ may be applied to the test substrate 10. That is, the second reference voltage may be applied to the gate electrode layer 40 through the second pad 74. The reference measurement voltage $V_M$ may be applied to the test substrate 10 through the first pad 72. The voltage changed within the range may be applied through the third pad 76 to measure the capacitance of the test memory device 110. The voltage range applied to the third pad 76 may be from about 0 V to a negative voltage, for example, about −7 V. When the voltage applied to the charge injection electrode 60 through the third pad 76 is less than about −7 V, i.e., an absolute value of the voltage may be greater than about 7 V, the insulation layer 50 may be damaged. Because the effective work function of the gate electrode layer 40 may be less than about 7 V, the effective work function of the gate electrode layer 40 may be sufficiently determined by applying the voltage of about 0 V to about −7 V to the charge injection electrode 60.

The voltage applying and the capacitance measurement may be performed through various methods and/or various devices. For example, the probe of the measurement device may make contact with the first to third pads 72, 74, and 76 to apply the voltage to the pads, thereby measuring the capacitance. The measurement device may include LCR meter, B1500A, etc.

In example embodiments, the second reference voltage, for example, about 0 V, may be applied to the gate electrode layer 40. The reference measurement voltage $V_M$ may be applied to the semiconductor substrate 10. The voltage applied to the charge injection electrode 40 may be changed from about 0 V to about 7 V. Because the voltage applied to the charge injection electrode 60 may correspond to the effective work function of the gate electrode layer 40, a size of the effective work function may be readily recognized directly without an additional calculation or a conversion, but the disclosure is not limited thereto. Thus, the range of the voltage applied to the charge injection electrode 60 may be changed. Further, the second reference voltage applied to the gate electrode layer 40 might not be about 0 V. In this case, a relative voltage realizing the reference measurement voltage V M may be applied to the gate electrode layer 40. The relative voltage may be a voltage providing the voltage between the gate electrode layer 40 and the semiconductor substrate 10 with the reference measurement voltage $V_M$. Alternatively, the second reference voltage may be applied to the semiconductor substrate 10, and the relative voltage may be applied to the gate electrode layer 40.

Figure 11:
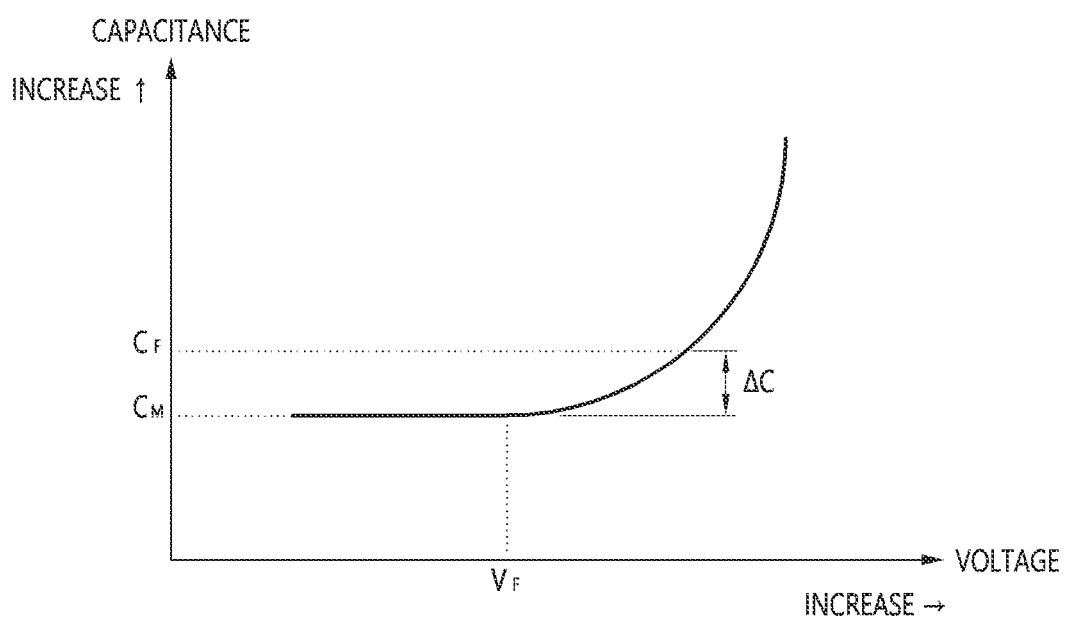
FIG. 11 is a view illustrating a curve representing a capacitance of a test memory device in accordance with voltages when a reference voltage is applied to a charge injection electrode.

Therefore, a curve with respect to the capacitance change of the test memory device 110 in accordance with the size of the voltage applied to the charge injection electrode 60 at the reference measurement voltage $V_M$, i.e., an absolute value of the voltage applied to the charge injection electrode 60 may be obtained in FIG. 11.

In step ST40, a size of a minimum voltage at which the capacitance change is no less than the reference value may be determined as the voltage corresponding to the effective work function of the gate electrode layer 40. That is, the size of the minimum voltage at which the capacitance change is no less than the reference value may be determined as the voltage corresponding to the effective work function of the gate electrode layer 40 from the measurement results of the capacitance of the test memory device 110 with the voltage applied to the charge injection electrode 60 being changed in FIG. 11. Because the voltage applied to the charge injection electrode 60 may have the negative voltage, a minimum value among the absolute values of the negative voltages may be the minimum voltage size.

Particularly, as shown in FIG. 11, the minimum voltage size $V_F$ representing the capacitance $C_F$, which may be greater than the reference measurement voltage $V_M$ by the reference change $\Delta C$, may be determined as the voltage corresponding to the effective work function of the gate electrode layer 40. Although a unit of the effective work function of the gate electrode layer 40 may be an electron volt and a unit of the voltage applied to the charge injection electrode 60 may be a volt, the effective work function and the voltage may have substantially an equal value based on one electron. Further, the change of the effective work function determined by the gate electrode layer 40 may have an importance compared to the size of the effective work function. Thus, when the material, the composition, or the process of the gate electrode 40a in the memory device 100a is changed, only an increasing or a decreasing of the size of the voltage applied to the charge injection electrode 60, i.e., the effective work function of the gate electrode 40a, may be determined. Thus, the minimum voltage size V F applied to the charge injection electrode 60 may be determined as the effective work function of the gate electrode 40 or 40a.

Thus, when the effective work function is determined from the voltage corresponding to the effective work function of the gate electrode layer 40, the effective work function of the gate electrode 40a in the memory device 100a may then be determined. That is, when the effective work function of the gate electrode layer 40 is determined, it may be determined that the effective work function of the gate electrode 40a in the memory device 100a may be substantially equal to or similar to the effective work function of the gate electrode layer 40.

According to example embodiments, the effective work function of the gate electrode 40 or the gate electrode layer 40a may be determined through a simple method including measuring the capacitance of the test memory device 110 in changing the voltage applied to the charge injection electrode 60. Particularly, the effective work function may be accurately and simply obtained under the condition that the memory layer 30 is attached to the gate electrode layer 40 on the test substrate 10, such as the wafer.

Alternatively, when the voltage of the test memory device 110 and the flatband voltage in accordance with the capacitance is repeatedly measured to determine the effective work function without the charge injection electrode 60, the characteristic of the memory layer 30 may be greatly influenced. That is, because the capacitance may be differentiated by the trapped amount of the oxide in the memory layer 30, the effective work function might not be accurately determined.

In example embodiments, the reference measurement voltage $V_M$ may be set so that the voltage applied to the charge injection electrode 60 at the reference measurement voltage $V_M$ may be changed, but the disclosure is not limited thereto. Thus, the capacitance in accordance with the voltage applied to the charge injection electrode 60 may be measured at a plurality of the reference measurement voltages $V_M$ between the threshold voltage $V_T$ and the flatband voltage $V_{FB}$ in step ST30. In step ST40, the capacitance change at the reference measurement voltages $V_M$ may be together analyzed to determine the effective work function. Thus, the capacitance change at the reference measurement voltages $V_M$ may be analyzed to improve the accuracy the determination of the effective work function.

Figure 12:
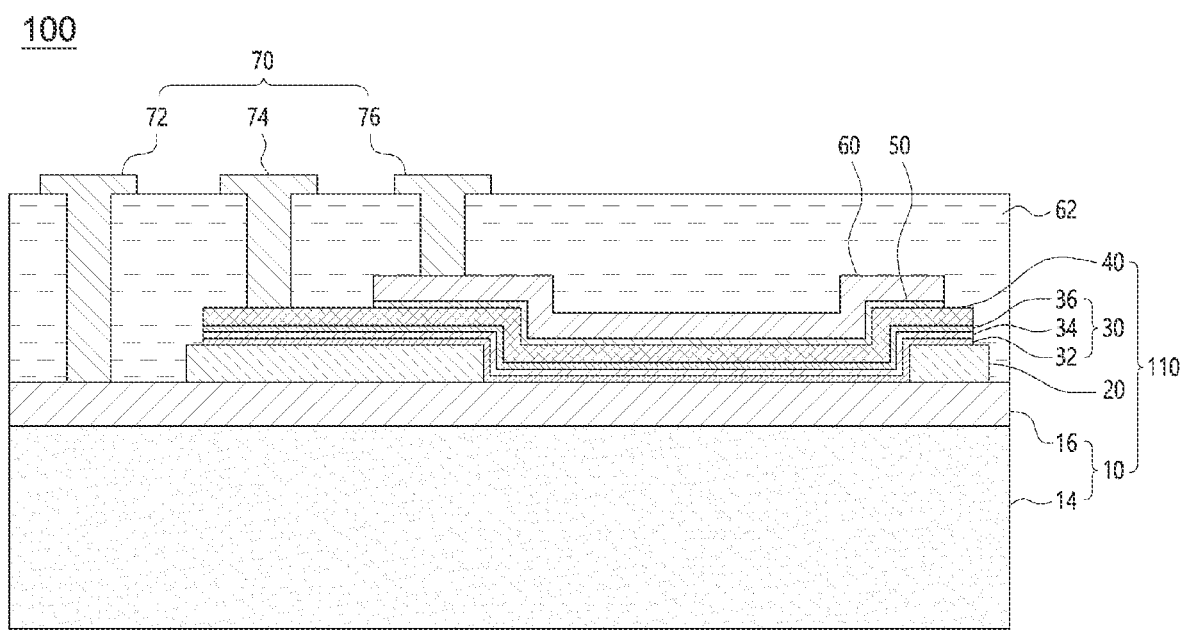
FIG. 12 is a cross-sectional view illustrating a test device for determining an effective work function in accordance with example embodiments.

In example embodiments, the test substrate 10 in the test device 100 may include the semiconductor material substrate 12, but the disclosure is not limited thereto. As shown in FIG. 12, the test substrate 10 may include a substrate 14 and a semiconductor layer 16 on the substrate 14.

The substrate 14 may include a semiconductor material substrate including a semiconductor material. Alternatively, the substrate 14 may include an insulation substrate. The substrate 14 may include a material substantially the same as or different from the material of the base substrate 12a of the memory device 100a.

The semiconductor layer 16 on the substrate 14 may be divided, corresponding to each of the device regions, to prevent interference by other test devices 100. Alternatively, the semiconductor layer 16 may include a single layer on a plurality of the devices regions to simplify the fabrication process.

The semiconductor layer 16 of the test memory device 110 may include a semiconductor material, such as silicon, germanium, a compound semiconductor in groups III-IV, etc. For example, the semiconductor layer 16 may include a semiconductor material having a p-type conductivity, for example, a p-type polycrystalline silicon layer. The semiconductor layer 16 of the test memory device 110 may include a material having a composition substantially the same as that of the semiconductor channel layer 10a of the memory device 100a, but the disclosure is not limited thereto. For example, the semiconductor layer 16 or the semiconductor channel layer 10a may include an n-type conductivity.

The semiconductor layer 16 may be formed by an apparatus for forming the semiconductor channel layer 10a of the memory device 100a. For example, the semiconductor layer 16 of the test memory device 110 may be formed under a same process condition using the apparatus for forming the semiconductor channel layer 10a of the memory device 100a. Thus, the test memory device 110 may have characteristics substantially the same as or similar to those of the memory device 100a to improve the accuracy and the reliability in determining the effective work function, but the disclosure is not limited thereto. In example embodiments, the memory device 100a may have the vertical structure and the test memory device 110 may have the planar structure so that the structure of the memory device 100a might not correspond to the structure of the test memory device 110. Therefore, the apparatus, the process, etc., for the memory devices 100a and 110 may be changed.

In example embodiments, a thickness of the semiconductor layer 16 of the test memory device 110 may be substantially equal to or different from the thickness of the semiconductor channel layer 10a of the memory device 100a. Because the thickness of the semiconductor layer 16 or the semiconductor channel layer 10a might not greatly affect the effective work function of the gate electrode 40a or the gate electrode layer 40, the difference in thickness between the semiconductor layer 16 and the semiconductor channel layer 10a may be inconsequential to the effective work function of the gate electrode 40a or the gate electrode layer 40.

For example, the thickness of the semiconductor layer 16 may be about 100 nm to about 500 nm. When the thickness of the semiconductor layer 16 is below about 100 m, the function of the semiconductor layer 16 might not be performed. In contrast, when the thickness of the semiconductor layer 16 is above about 500 m, the process for forming the semiconductor layer 16 may be increased, but the disclosure is not limited thereto. In example embodiments, the thickness of the semiconductor layer 16 may function as the metal-oxide-semiconductor (MOS) capacitor.

Alternatively, the semiconductor layer 16 may be formed at various substrates 14 to be used as the semiconductor substrate 10.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A test device for determining an effective work function, the test device comprising:
    a test memory device including a memory layer and a gate electrode layer on a semiconductor substrate;
    an insulation layer on the test memory device; and
    a charge injection electrode on the insulation layer to inject a charge into the test memory device based on a voltage applied to the charge injection electrode.

2. The test device of claim 1, wherein the effective work function of the gate electrode layer is determined by a change of a capacitance of the test memory device based on the voltage applied to the charge injection electrode.

3. The test device of claim 2, wherein the capacitance of the test memory device is measured in changing a voltage between the gate electrode layer and the semiconductor substrate when the voltage is not applied to the charge injection electrode to obtain reference information for setting a reference measurement voltage, and
    wherein the capacitance of the test memory device is measured in changing the voltage applied to the charge injection electrode when the reference measurement voltage is applied to the gate electrode layer and the semiconductor substrate to determine the effective work function of the gate electrode layer.

4. The test device of claim 1, wherein the insulation layer has a thickness less than a thickness of the memory layer.

5. The test device of claim 1, wherein the insulation layer includes at least one of oxide and nitride.

6. The test device of claim 1, wherein the charge injection electrode includes a material having a work function equal to or greater than a work function of the gate electrode layer.

7. The test device of claim 1, further comprising:
    a first pad electrically connected to the semiconductor substrate;
    a second pad electrically connected to the gate electrode layer; and
    a third pad electrically connected to the charge injection electrode.

8. The test device of claim 7, wherein a first pad region for connecting the first pad with a first effective region in which the memory layer and the gate electrode layer are positioned is defined on the semiconductor substrate,
    a second pad region for connecting the second pad with a second effective region in which the insulation layer and the charge injection electrode are positioned is defined on the gate electrode layer, and
    a third pad region for connecting the third pad with an active region for determining the effective work function is defined on the charge injection electrode.

9. The test device of claim 8, wherein the first pad region, the second pad region, and the third pad region are sequentially arranged at one side of the test device, and
    wherein the active region is arranged at the other side of the test device.

10. The test device of claim 1, wherein the memory layer and the gate electrode layer include portions substantially parallel to the semiconductor substrate.

11. A method of manufacturing a test device for determining an effective work function of a gate electrode in a memory device, the memory device including a semiconductor channel layer, a memory layer, and the gate electrode, the method comprising:
    forming a test memory device including a memory layer and a gate electrode layer on a semiconductor substrate, the memory layer including a material substantially the same as a material of the memory layer in the memory device, and the gate electrode layer including a material substantially the same as a material of the gate electrode in the memory device;
    forming an insulation layer on the test memory device; and
    forming a charge injection electrode, which injects a charge into the test memory device by applying a voltage, on the insulation layer.

12. The method of claim 11, wherein the memory layer is formed through a process substantially the same as a process for forming the memory layer in the memory device, and
    wherein the gate electrode layer is formed through a process substantially the same as a process for forming the gate electrode in the memory device.

13. A method of determining an effective work function of a gate electrode layer using a test memory device, an insulation layer and a charge injection electrode, the test memory device including a memory layer and the gate electrode layer on a semiconductor substrate and the insulation layer on the test memory device, the method comprising:
    measuring a capacitance change of the test memory device based on voltages applied to the charge injection electrode to determine the effective work function of the gate electrode layer.

14. The method of claim 13, further comprising:
    measuring the capacitance of the test memory device based on the voltages applied to the charge injection electrode; and
    determining a size of a minimum voltage, among the voltage applied to the charge injection electrode at which the capacitance change is no less than a reference value, as a voltage corresponding to the effective work function.

15. The method of claim 14, before measuring the capacitance of the test memory device, further comprising:
    measuring the capacitance of the test memory device in changing a voltage between the gate electrode layer and the semiconductor substrate when the charge injection electrode is not biased to obtain reference information corresponding to a reference voltage-capacitance curve; and
    setting a reference measurement voltage, which is applied to the gate electrode layer and the semiconductor substrate in measuring the capacitance of the test memory device, the reference value used in determining the effective work function using the reference voltage-capacitance curve.

16. The method of claim 15, wherein the reference measurement voltage is a voltage between a threshold voltage and a flatband voltage in the reference voltage-capacitance curve, and
    wherein the reference value is a ratio of a maximum change of the capacitance when the maximum change of the capacitance is a difference between a minimum capacitance and an accumulation capacitance on the reference voltage-capacitance curve.

17. The method of claim 15, wherein the reference measurement voltage is a median between the threshold voltage and the flatband voltage, and
    wherein the reference value is 10% of the maximum change of the capacitance.

18. The method of claim 15, wherein the capacitance of the test memory device is measured in changing the voltage applied to the charge injection electrode when the reference measurement voltage is applied to the gate electrode layer and the semiconductor substrate.

19. The method of claim 15, wherein the capacitance of the test memory device is measured in changing the voltage applied to the semiconductor substrate when a first reference voltage is applied to the gate electrode layer in obtaining the reference information, and
    wherein the capacitance of the test memory device is measured in changing the voltage applied to the charge injection electrode when a second reference voltage is applied to the gate electrode layer and a relative voltage realizing the reference measurement voltage is applied to the semiconductor substrate in measuring the capacitance.

\* \* \* \* \*